US010866531B2

(12) United States Patent
Cosijns et al.

(10) Patent No.: US 10,866,531 B2
(45) Date of Patent: Dec. 15, 2020

(54) ATHERMALIZATION OF AN ALIGNMENT SYSTEM (71) Applicants: ASML Netherlands B.V., Veldhoven (NL); ASML Holding N.V., Veldhoven (NL)

(72) Inventors: Suzanne Johanna Antonetta Geertruda Cosijns, Casteren (NL); Maarten Van Der Heijden, Geldrop (NL); Frederikus Johannes Maria De Vreede, Valkenswaard (NL); David Taub, Stamford, CT (US); Eric Emery, Stamford, CT (US); Joseph Ashwin Franklin, Norwalk, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 16/331,710

(22) PCT Filed: Sep. 4, 2017

(86) PCT No.: PCT/EP2017/072092
§ 371 (c)(1),
(2) Date: Mar. 8, 2019

(87) PCT Pub. No.: WO2018/064157
PCT Pub. Date: Apr. 12, 2018

(65) Prior Publication Data
US 2019/0219927 A1 Jul. 18, 2019

Related U.S. Application Data
(60) Provisional application No. 62/403,959, filed on Oct. 4, 2016.

(51) Int. Cl.
G03F 7/20 (2006.01)
G03F 9/00 (2006.01)

(52) U.S. Cl.
CPC .......... G03F 7/7095 (2013.01); G03F 7/7085 (2013.01); G03F 7/70825 (2013.01); G03F 9/7096 (2013.01)

(58) Field of Classification Search
CPC ..... G03F 7/7085; G03F 7/7095; G03F 9/7096
See application file for complete search history.

(56) References Cited

U.S. PATENT DOCUMENTS 5,781,277 A * 7/1998 Iwamoto ............. G03F 7/70358
355/53
6,208,408 B1 * 3/2001 Takabayashi ....... G03F 7/70241
355/53

(Continued)

FOREIGN PATENT DOCUMENTS

CN 1538243 A 10/2004
CN 1617048 A 5/2005

(Continued)

OTHER PUBLICATIONS

International Search Report and Written Opinion of the International Searching Authority directed to related International Patent Application No. PCT/EP2017/072092, dated Dec. 1, 2017; 10 pages.

(Continued)

Primary Examiner — Deoram Persaud
(74) Attorney, Agent, or Firm — Sterne, Kessler, Goldstein & Fox P.L.L.C (57) ABSTRACT An alignment system configured to be substantially insensitive to thermal variations in its system during alignment measurements. The alignment system includes a sensor system, a support structure, a sensing element, a position measurement system, and an athermal interface between the (Continued)

sensing element and the support structure. The sensor system is configured to determine a position of an alignment mark on a substrate and the support structure is configured to support the sensor system. The sensing element is configured to detect an unintentional displacement of the support structure and the position measurement system is configured to measure the unintentional displacement relative to a reference element based on the detected unintentional displacement. The athermal interface is configured to prevent detection of temperature induced displacement of the support structure by the sensing element.

19 Claims, 7 Drawing Sheets (56) References Cited

U.S. PATENT DOCUMENTS

| | | | |
|---|---|---|---|
| 6,525,802 | B1 | 2/2003 | Novak |
| 6,879,375 | B1* | 4/2005 | Kayama ............... G03F 7/70691 |
| | | | 248/550 |
| 7,130,019 | B2 | 10/2006 | Bartray et al. |
| 7,170,580 | B2 | 1/2007 | Leenders et al. |
| 7,804,579 | B2 | 9/2010 | Loopstra et al. |
| 8,767,172 | B2* | 7/2014 | Ebihara ................... G03F 7/709 |
| | | | 355/53 |
| 9,383,328 | B2* | 7/2016 | Laufer .................. G03F 7/7085 |
| 9,804,506 | B2 | 10/2017 | Arai |
| 10,191,393 | B2 | 1/2019 | Westerlaken et al. |
| 2007/0081141 | A1 | 4/2007 | Cornelissen et al. |
| 2008/0319569 | A1* | 12/2008 | Loopstra ............. G03F 7/70775 |
| | | | 700/110 |
| 2009/0231561 | A1 | 9/2009 | Arai |
| 2012/0050709 | A1* | 3/2012 | Van Der Pasch ... G03F 7/70725 |
| | | | 355/67 |
| 2012/0147352 | A1 | 6/2012 | Ito |
| 2012/0268724 | A1 | 10/2012 | De Doer et al. |
| 2013/0128254 | A1 | 5/2013 | Badami |
| 2013/0343422 | A1 | 12/2013 | Laufer |
| 2015/0109598 | A1 | 4/2015 | Verger |
| 2015/0168852 | A1* | 6/2015 | Beerens .............. G03F 7/70783 |
| | | | 355/72 |
| 2018/0157353 | A1* | 6/2018 | Sleeman ................ G01D 5/241 |
| 2019/0129317 | A1* | 5/2019 | Ronde ................. G03F 7/70766 |

FOREIGN PATENT DOCUMENTS

| | | |
|---|---|---|
| CN | 101364049 A | 2/2009 |
| CN | 1017551188 A | 6/2010 |
| JP | 2009-016820 A | 1/2009 |
| JP | 2015-513219 A | 4/2015 |
| JP | 2018-511081 A | 4/2018 |
| WO | WO 2009/011356 A1 | 9/2010 |
| WO | WO 2016/150631 A1 | 9/2016 |

OTHER PUBLICATIONS

International Preliminary Report on Patentability directed to related International Patent Application No. PCT/EP2017/072092, dated Apr. 9, 2019; 7 pages.

Chinese Office Action from related Chinese Patent Application No. 201780061155, dated Jul. 20, 2020; 22 pages.

* cited by examiner

ATHERMALIZATION OF AN ALIGNMENT SYSTEM

CROSS-REFERENCE TO RELATED APPLICATIONS

This application claims priority of U.S. Provisional Patent Application No. 62/403,959, which was filed on Oct. 4, 2016, and which is incorporated herein in its entirety by reference.

FIELD

The present disclosure relates to an alignment system that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. Lithographic apparatus may use an alignment system for detecting positions of the alignment marks and for aligning the substrate using the alignment marks to ensure accurate exposure from a mask.

An alignment system may have a sensor system for detecting the positions of the alignment marks with respect to a measurement axis (e.g., optical axis) of the sensor system and a position measurement system for detecting any unintentional displacement of the measurement axis with respect to a reference element. One type of unintentional displacement of the sensor system may be due to mechanical vibrations of the sensor system during the operation of, for example, the alignment system or the lithography apparatus. The detected positions of the alignment marks, which are correlated to a position of a substrate stage are corrected for the detected unintentional displacement of the measurement axis.

One of the disadvantages of the current position measurement system is that it senses any type of unintentional displacement of the sensor system as a displacement of the measurement axis and corrects the detected positions of the alignment marks for such a displacement. However, not all type of displacements of the sensor system results in a displacement of the measurement axis. For example, a displacement of the sensor system due to a thermal expansion of one or more parts of the sensor system does not necessarily result in a displacement of the measurement axis. The thermal expansion, which may be due to thermal effects from the operation of, for example, the alignment system or the lithography apparatus may occur symmetrically with respect to the measurement axis. Such symmetrical thermal expansion may occur when a thermal center of the one or more parts of the sensor system coincides with the measurement axis. Thermal center of a body may be defined as a point location in space associated with the body that is insensitive to thermal expansion of the body. As such, corrections made to the detected positions of the alignment marks based on such symmetrical thermal displacement of the sensor system may result in misalignment of the substrate.

SUMMARY

Accordingly, there is a need for reducing or substantially eliminating the sensitivity of measurements in an alignment system due to thermal variations induced in the alignment system during its operation to improve the accuracy of the alignment measurements.

According to an embodiment, an alignment system includes a sensor system, a support structure, a sensing element, a position measurement system, and an athermal interface between the sensing element and the support structure. The sensor system is configured to determine a position of an alignment mark on a substrate and the support structure is configured to support the sensor system. The sensing element is configured to detect an unintentional displacement of the support structure and the position measurement system is configured to measure the unintentional displacement relative to a reference element based on the detected unintentional displacement. The athermal interface is configured to prevent detection of temperature induced displacement of the support structure by the sensing element.

In another embodiment, a lithographic apparatus includes an illumination optical system configured to illuminate a pattern of a patterning device and a projection system configured to project an image of the pattern on to a target portion of a substrate. The apparatus further includes an alignment system. The alignment system includes a sensor system, a support structure, a sensing element, a position measurement system, and an athermal interface between the sensing element and the support structure. The sensor system is configured to determine a position of an alignment mark on a substrate and the support structure is configured to support the sensor system. The sensing element is configured to detect an unintentional displacement of the support structure and the position measurement system is configured to correct the determined position of the alignment mark based on the detected unintentional displacement of the support structure. The athermal interface is configured to prevent detection of temperature induced displacement of the support structure by the sensing element.

Yet in another embodiment, an alignment system includes an optical system, a detector, a support structure, a sensing element, a position measurement system, and an athermal interface between the sensing element and the support structure. The optical system is configured to focus a radiation beam on an alignment mark on a substrate, the detector is configured to determine a position of the alignment mark, and the support structure is configured to support the optical system. The sensing element is configured to detect an unintentional displacement of the support structure and the position measurement system is configured to correct the determined position of the alignment mark based on the detected unintentional displacement of the support structure. The athermal interface is configured to prevent detection of temperature induced displacement of the support structure by the sensing element.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
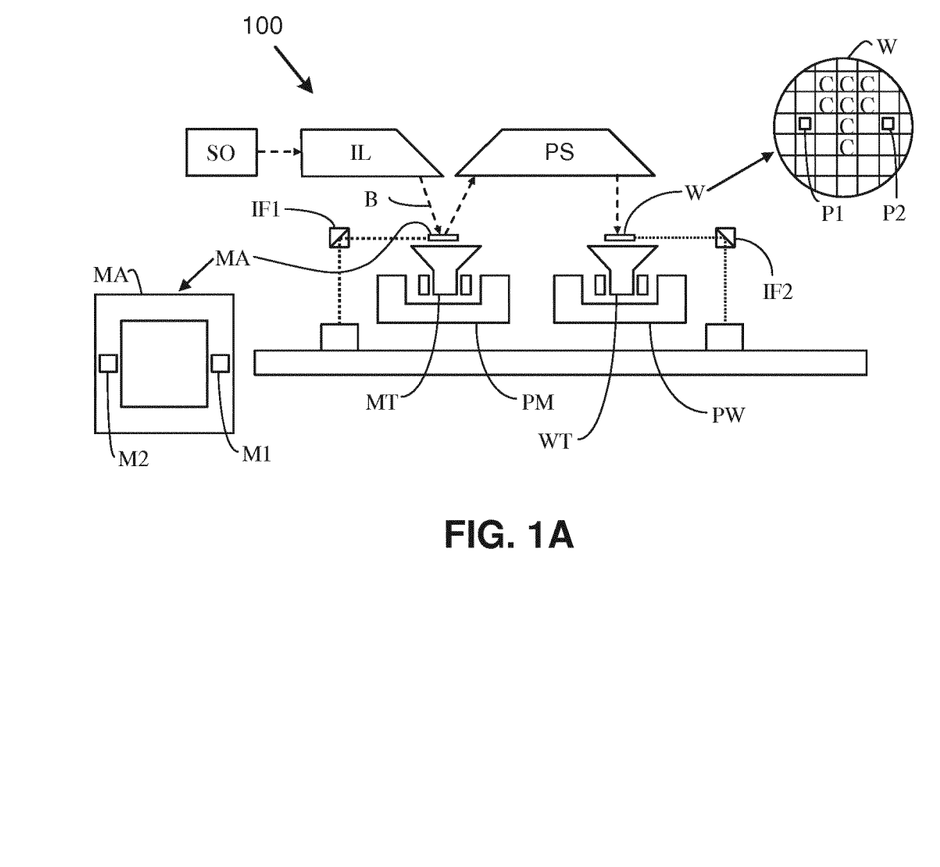
FIG. 1A is a schematic illustration of a reflective lithographic apparatus according to an embodiment of the invention.
Figure 1B:
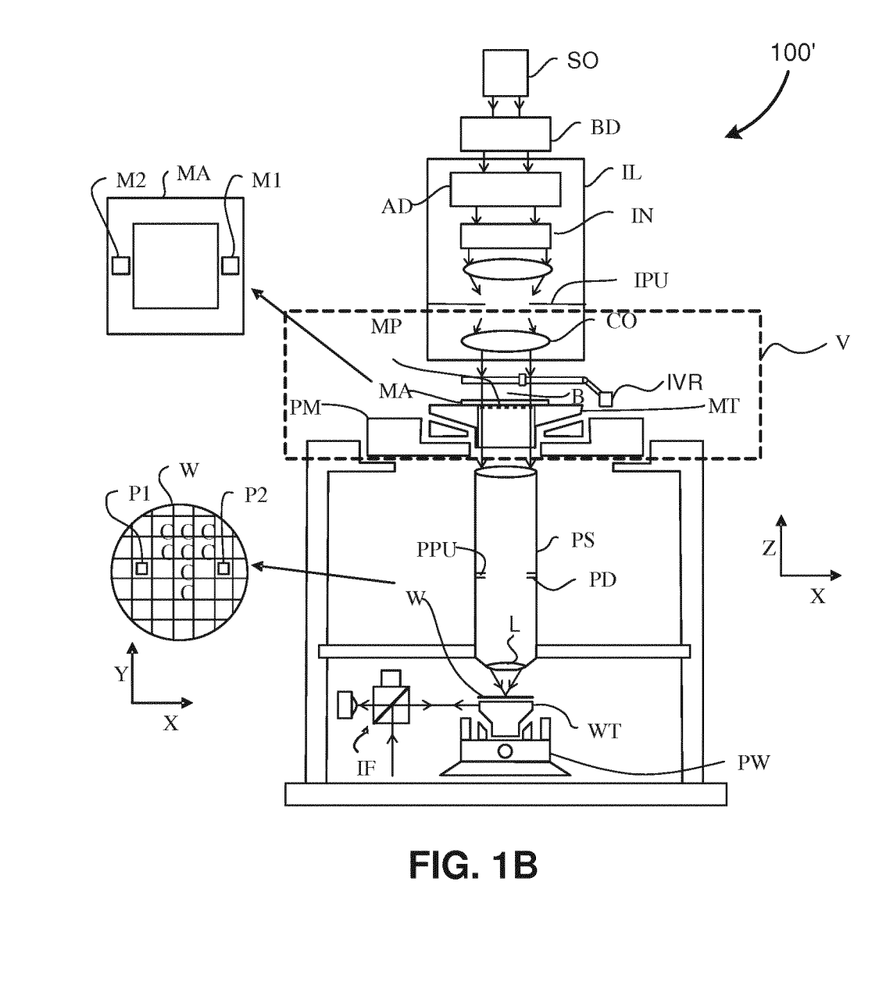
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
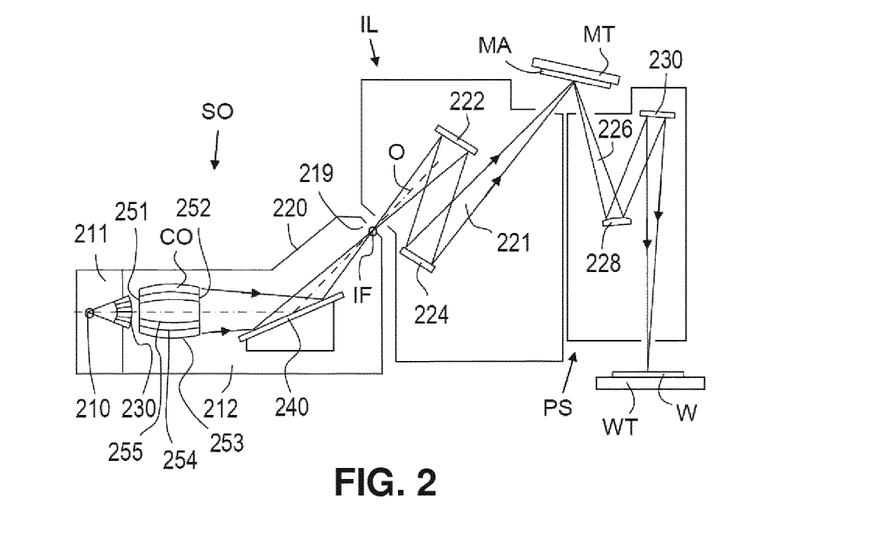
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
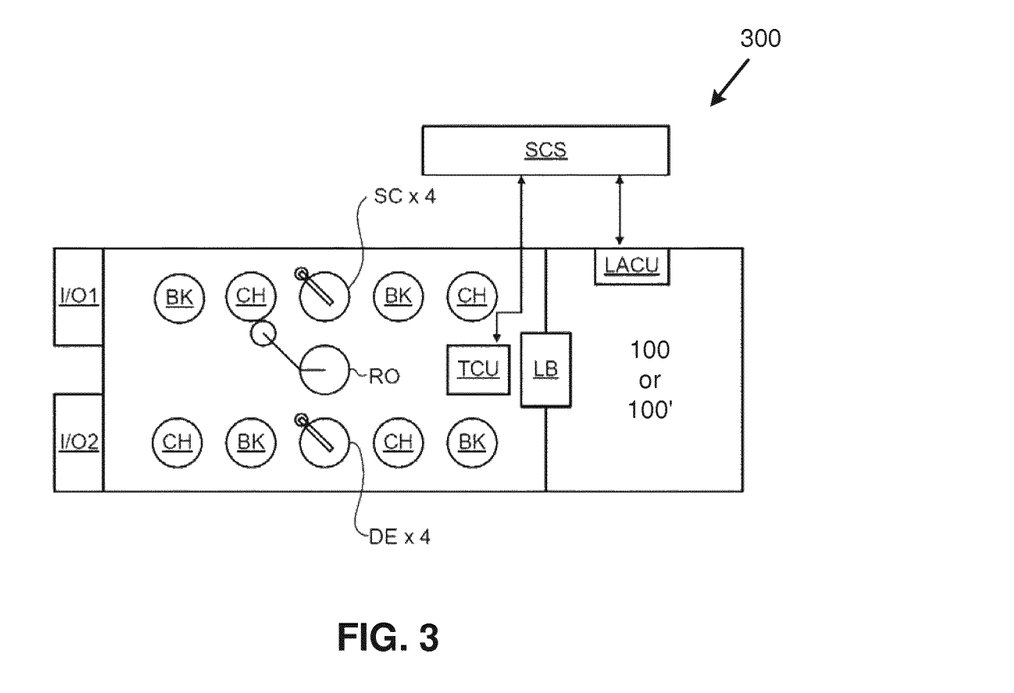
FIG. 3 is a schematic illustration of a lithographic cell, according to an embodiment of the invention.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

An Alignment System According to an Embodiment

Figure 4:
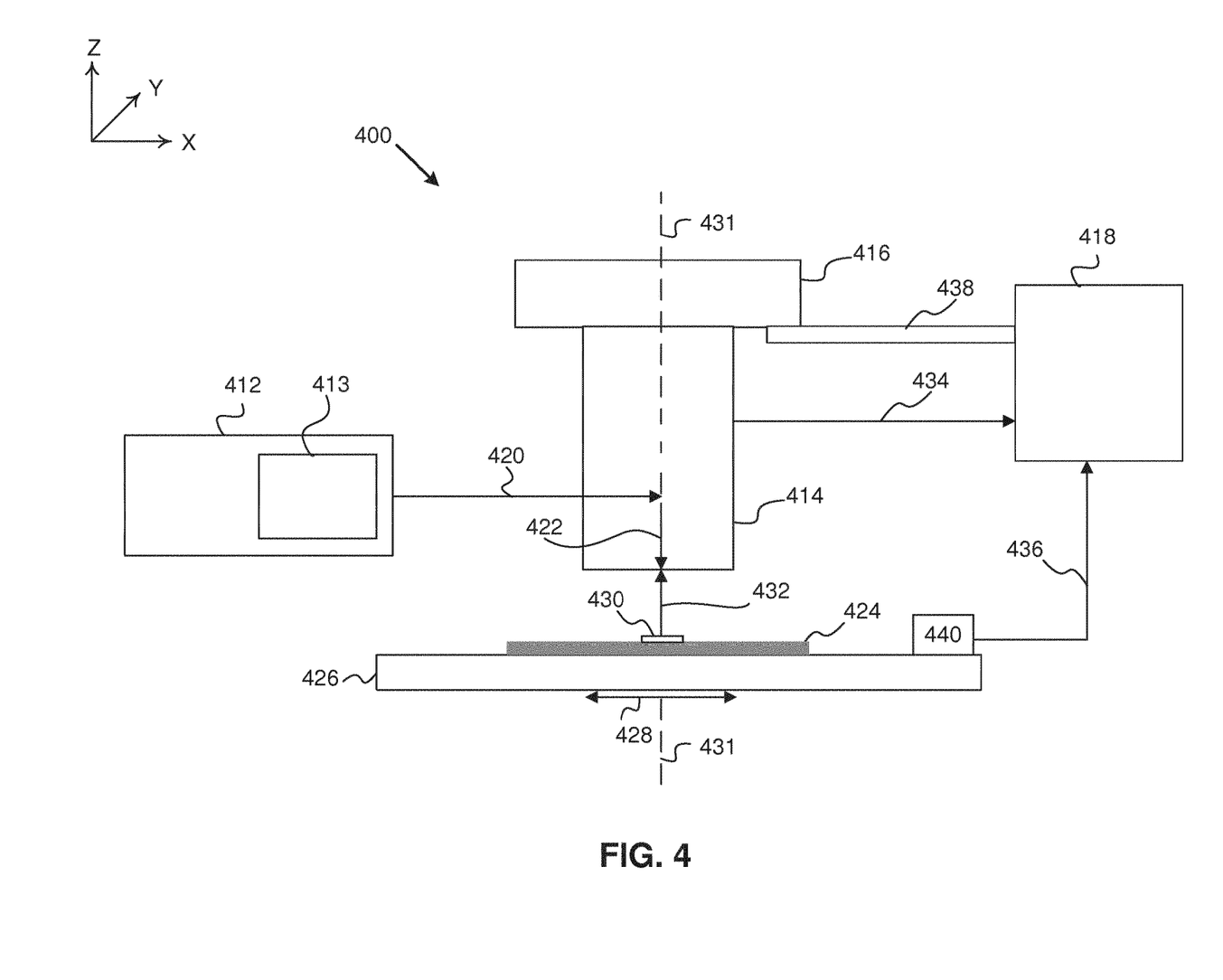
FIG. 4 is a schematic illustration of an alignment system, according to an embodiment of the invention.

FIG. 4 illustrates a schematic of a cross-sectional view of an alignment system 400 that can be implemented as a part of lithographic apparatus 100 or 100', according to an embodiment. In an example, alignment system 400 may be configured to align a substrate (e.g., substrate W) with respect to a patterning device (e.g., patterning device MA). Alignment system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

Alignment system 400 may include an illumination system 412, a sensor system 414, a position measurement system 418, and a sensing element 438. Illumination system 412 may include a tunable radiation source 413 configured to provide an electromagnetic narrow band radiation beam 420 having one or more discrete narrow passbands. Each of the one or more discrete narrow passbands may have a desired constant center wavelength (CWL) value and a bandwidth of few nanometers wide (e.g., between about 1 nm to about 12 nm), according to an embodiment. Tunable radiation source 413 may be configured to tune the one or more discrete narrow passbands over a continuous and broad spectrum of wavelengths ranging from about 500 nm to about 900 nm. Tunability of tunable radiation source 413 may allow selection of wavelengths that fall in spectral gaps between, or outside of, currently available discrete passbands in illumination systems.

Sensor system 414 may be configured to receive radiation beam 420 and direct a radiation sub-beam 422, which is a part of radiation beam 420 onto a substrate 424 placed on a stage 426 moveable along direction 428 (e.g., along X-axis). Radiation sub-beam 422 may be configured to illuminate an alignment mark (also may be referred as alignment target) 430 formed on substrate 424 along a measurement axis 431 of sensor system 414. Measurement axis 431 may be aligned with an optical axis of sensor system 414. Alignment mark 430 may be coated with a radiation sensitive film in an example. In another example, alignment mark 430 may have one hundred and eighty degree symmetry. That is, when alignment mark 430 is rotated one hundred and eighty degrees about an axis of symmetry perpendicular to a plane of alignment marks 430, rotated alignment mark 430 may be substantially identical to unrotated alignment mark 430. In an example, the axis of symmetry of alignment mark 430 is aligned with measurement axis 431.

Sensor system 414 may be further configured to receive a diffracted radiation beam 432. In an example, diffracted radiation beam 432 may be at least a portion of radiation sub-beam 422 that may be reflected from alignment mark 430 when the axis of symmetry of alignment mark 430 is aligned with measurement axis 431. Based on diffracted radiation beam 432, sensor system 414 may be configured to determine a position of alignment mark 430 (e.g., position of the center of symmetry of alignment mark 430) and consequently, detect a position of substrate 424 with respect to a first reference element (not shown). First reference element may be any component of alignment system 400, lithographic apparatus 100 and 100', or a stand-alone structure.

Position measurement system 418 may be configured to receive signals 434 and 436. Signal 434 may include information of the detected positions of alignment mark 430 and substrate 424 and signal 436 may include information of the position of stage 426. Position of stage 426 may be detected by a stage position measurement system 440 coupled to stage 426. Based on the information from signals 434 and 436, position measurement system 418 may be configured to correlate the position of stage 426 with the position of alignment mark 430 and substrate 424. As such, the position of alignment mark 430 and the position of substrate 424 may be determined with reference to stage 426 and these positions may be stored in a storage device (not shown) included in position measurement system 418 or in a processing unit (not shown) coupled to position measurement system 418.

Position measurement system 418 may be further configured to detect and correct errors in determining the position of alignment mark 430 and consequently, prevent misalignment of substrate 424. The errors may be due to unintentional displacement of measurement axis 431 from a desired location during the operation of alignment system 400. Position measurement system 418 may be configured to measure the unintentional displacement of measurement axis 431 from the desired location with respect to a second reference element. Second reference element may be any component of alignment system 400, lithographic apparatus 100 and 100', or a stand-alone structure. In an example, the first and second reference elements may be two different elements or may be the same element.

In order to detect these errors due to the unintentional displacement of measurement axis 431, one or more sensing elements such as sensing element 438 may be coupled to position measurement system 418 and a support structure 416 of sensor system 414. Support structure 416 may be configured to hold and couple sensor system 414 to other components of alignment system 400 and/or lithographic apparatus 100 and 100'. Sensing element 438 may include any type of position sensors, such as but not limited to encoders, interferometers, capacitive positive sensors, or any combination thereof. Sensing element 438 may be configured to detect any unintentional lateral displacement (e.g., along X-axis and/or Y-axis) of support structure 416 relative to the second reference element. In some examples, additionally or alternatively sensing elements such as sensing element 438 may be coupled to other component(s) of sensor system 414 and may be configured to detect any unintentional lateral displacements (e.g., along X-axis and/or Y-axis) of these components relative to the second reference element.

Based on the unintentional lateral displacement detected by sensing element 438, position measurement system 418 may be configured to measure the displacement and correct the determined position of alignment mark 430 stored in the storage device, and consequently, correct the correlation between the position of stage 426 with the position of alignment mark 430 and substrate 424.

The unintentional displacement may be due to mechanical vibrations of the sensor system during the operation of, for example, alignment system 400 or lithography apparatus 100 or 100'. The unintentional displacement may be also due to thermal expansion of support structure 416 from thermal effects induced in, for example, alignment system 400 or the lithography apparatus 100 or 100' during its operation. However, the displacement due to thermal expansion of support structure 416 and/or other components of sensor system 414 does not necessarily result in a displacement of measurement axis 431. The thermal expansion may occur symmetrically with respect to measurement axis 431 without displacing measurement axis 431 from the desired location. As an interface between sensing element 438 and support structure 416 is not symmetrical with respect to measurement axis 431, sensing element 438 senses such symmetrical expansion as an asymmetrical lateral displacement of measurement axis 431. Thus, corrections made by position measurement system 418 to the determined position of alignment mark 430 based on such symmetrical thermal displacement of support structure 416 may result in misalignment of substrate 424.

Such errors in displacement detection by sensing element 438, and consequently, errors in displacement measurement by position measurement system 418 may be prevented with the introduction of an athermal symmetrical interface between sensing element 438 and support structure 416. Various embodiments of alignment systems with such athermal symmetrical interface to improve the accuracy of lateral displacement detection and measurement by the alignment systems are described below.

An Alignment System Having a Measurement Frame According to a First Embodiment

Figure 5:
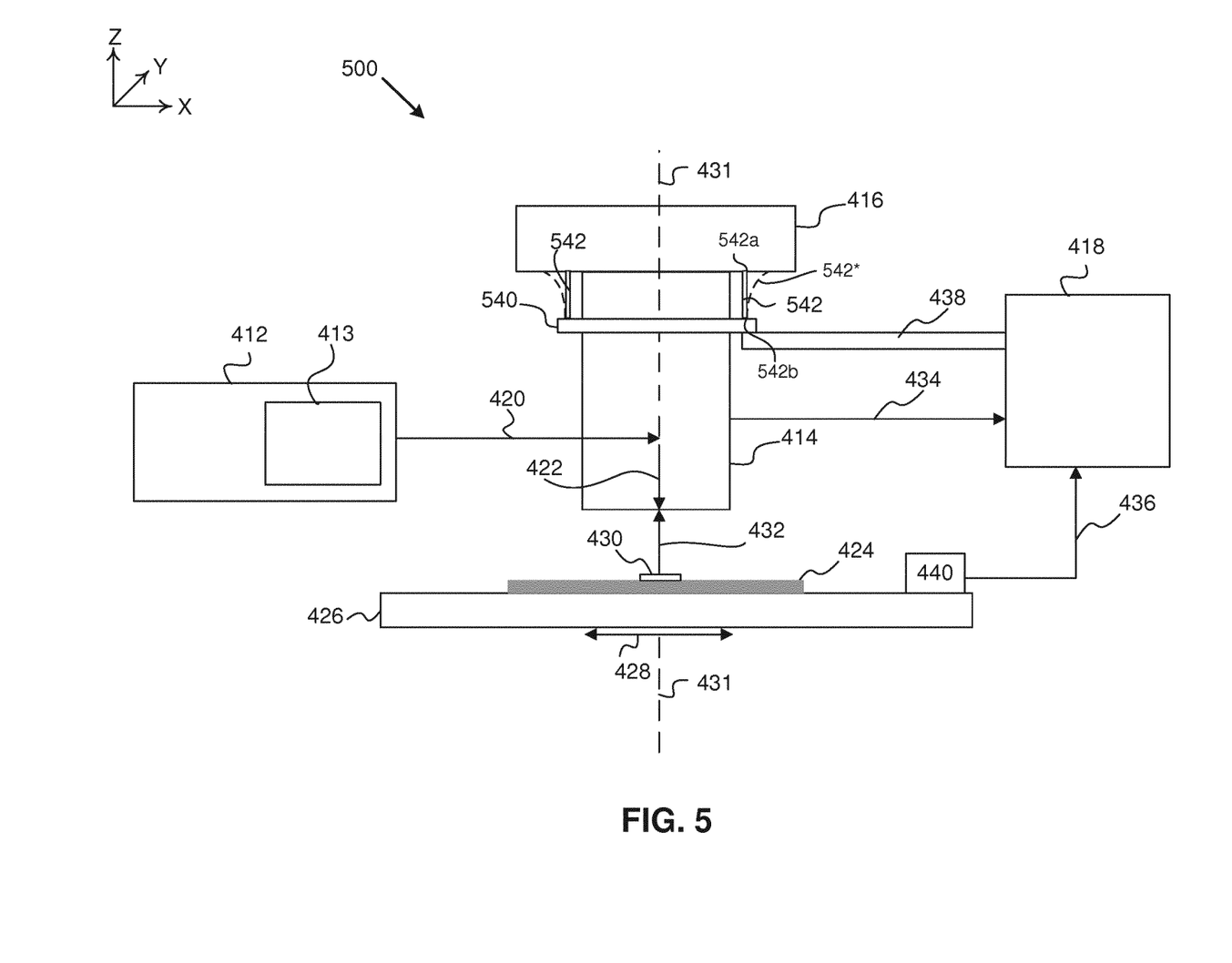
FIG. 5 is a schematic illustration of an alignment system having a measurement frame, according to an embodiment of the invention.

FIG. 5 illustrates a schematic of a cross-sectional view of an alignment system 500 that can be implemented as a part of lithographic apparatus 100 or 100', according to an embodiment. Alignment system 500 may be similar to alignment system 400 in structure and function. The differences between alignment systems 400 and 500 are discussed below.

In addition to illumination system 412, sensor system 414, position measurement system 418, and sensing element 438, as described above, alignment system 500 may include an athermal symmetrical interface having a measurement frame 540 and flexible mounts 542 between sensing element 438 and support structure 416. The introduction of measurement frame 540 and flexible mounts 542 as an interface between sensing element 438 and support structure 416 may help to prevent the errors, discussed above with reference to alignment system 400. That is, such an interface may help to prevent errors in the detection of lateral displacement of measurement axis 431 due to thermal variations in support structure 416. In an example, measurement frame 540 may be positioned around sensor system 414 such that its axis of symmetry is aligned with measurement axis 431. Measurement frame 540 may be constructed to have dimensions such that the outer periphery of sensor system 414 is not in contact with the inner periphery of measurement frame 540 when it is positioned around sensor system 414. Measurement frame 540 may include a non-magnetic material having a coefficient of thermal expansion (CTE) less than about 5 ppm/K. In some examples, measurement frame 540 may include a non-magnetic material (e.g., Zerodur, Cordierite) having a CTE of about 0.02 ppm/K. In other examples, measurement frame 540 may include a non-magnetic material having a CTE that is at least about 5 times, about 10 times, about 50 times, about 100 times, about 200 times, about 400 times, or about 1000 times smaller than a CTE of a magnetic or non-magnetic material included in support structure 416.

Flexible mounts 542 may include three flexible mounts for mounting measurement frame 540 on support structure 416. Flexible mounts 542 may be radially arranged with respect to measurement axis 431. Each of flexible mounts 542 may be positioned at an equal distance from measurement axis 431 and at an equal angular distance from the adjacent flexible mounts. In some embodiments, each of flexible mounts 542 may be attached to measurement frame 540 and positioned on support structure 416 such that a thermal center of measurement frame 540 and/or support structure 416 is aligned with measurement axis 431. A first end 542a of each of flexible mounts 542 may be rigidly coupled to support structure 416 and a second end 54b, opposite to the first end 542a, of each of flexible mounts 542 may be rigidly coupled to measurement frame 540. Flexible mounts 542 may be constructed such that the tensile and lateral stiffness of each of flexible mounts 542 are higher than its bending stiffness. In an example, ratio of the tensile and lateral stiffness to the bending stiffness of each of flexible mounts 542 is about 1:1000. In another example, flexible mounts 542 may be constructed such that each of flexible mounts 542 has a stiffness or a Young's modulus higher than a stiffness or a Young's modulus of measurement frame 540. The ratio of the stiffness of each of flexible mounts 542 to the stiffness of measurement frame 540 may be greater than or equal to 1000, according to an example. In an example, flexible mount 542 may include a leaf spring. In some embodiments, the material, geometry, and/or orientation of flexible mounts 542 with respect to each other or measurement axis 431 are selected such that a thermal center of measurement frame 540 and/or support structure 416 is aligned with measurement axis 431.

Figure 6:
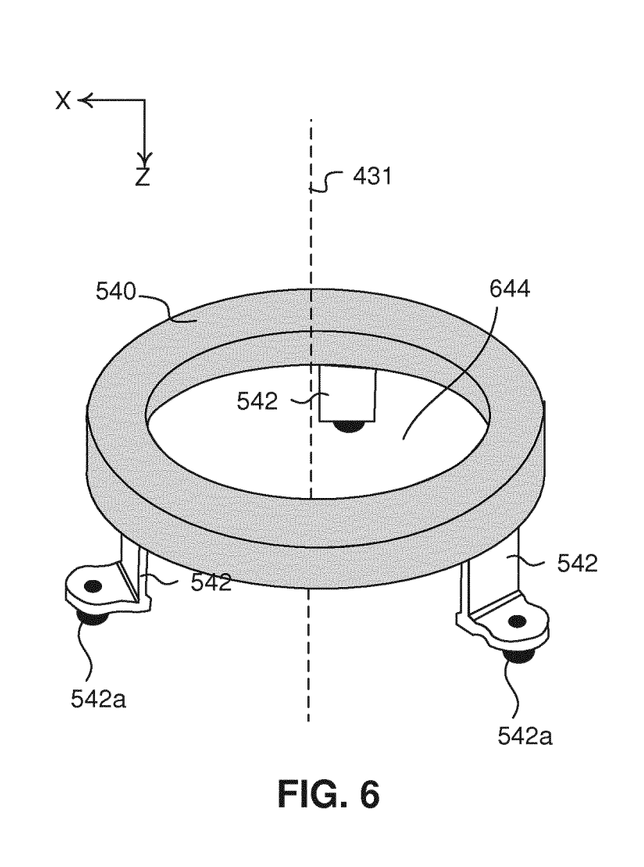
FIG. 6 is a schematic illustration of a measurement frame of an alignment system, according to an embodiment of the invention.

An isometric view of measurement frame 540 and flexible mounts 542 of alignment system 500 are illustrated in FIG. 6, according to an embodiment. Flexible mounts 542 are radially arranged with respect to measurement axis 431. Measurement frame 540 may have a circular geometry with an opening 644. Sensor system 414 (as shown in FIG. 5) may be positioned within opening 644. Measurement frame 540 may not be limited to the circular geometry as shown in FIG. 6, but may have any geometric shape (e.g., rectangular, triangular, elliptical) without departing from the scope of the invention.

Figure 7:
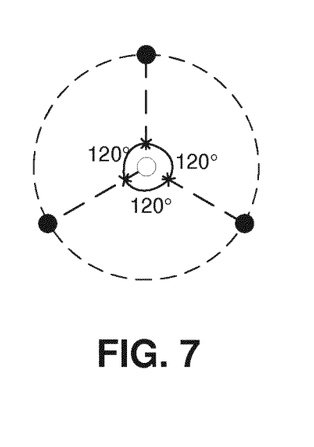
FIGS. 7-10 are various mount orientations of a measurement frame of an alignment system, according to various embodiments of the invention.
Figure 8:
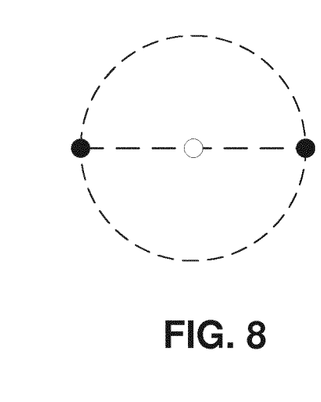
Figure 9:
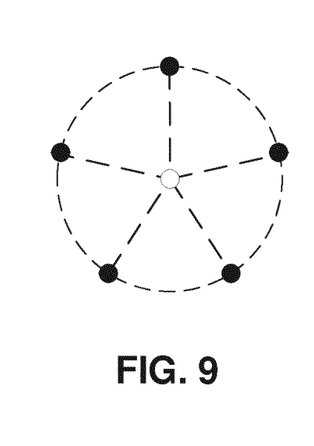
Figure 10:
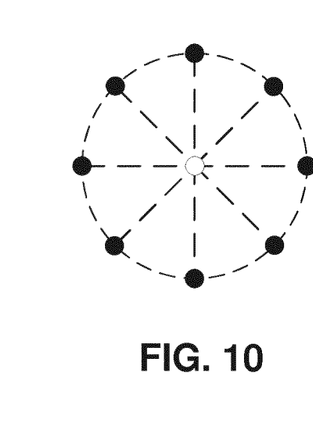

The orientation of flexible mounts 542 with respect to each other and measurement axis 431 is further illustrated in FIG. 7. The black solid circles of FIG. 7 represent the locations of flexible mounts 542 on support structure 416 (not shown in FIG. 7) and the open circle represent the location of measurement axis 431. FIG. 7 shows each of the three flexible mounts 542 positioned at an equal distance from measurement axis 431 and at an equal angular distance of 120° from the adjacent flexible mounts. It should be noted that flexible mounts 542 may include any m number of flexible mounts, with m being greater than 2 and is not limited to the three flexible mounts discussed above. Similar to FIG. 7, FIGS. 8-10 show some example orientations for two, five, and eight flexible mounts, similar to flexible mounts 542, that may be used for mounting measurement frame 540 on support structure 416 as shown in FIG. 5. In the orientations shown in FIGS. 8-10, each of the flexible mounts are positioned at an equal distance from measurement axis 431 and at an equal angular distance of from the adjacent flexible mounts.

Referring back to FIG. 5, measurement frame 540 and flexible mounts 542 may be symmetrically oriented along measurement axis 431. So, force exerted on first ends 542a of flexible mounts 542 during any symmetrical thermal expansion of support structure 416 with respect to measurement axis 431 may be uniformly distributed on support structure 416 without causing any resultant lateral displacement of measurement frame 540. The force may cause outward bending of flexible mounts 542 as shown with dashed lines 542*. Such bending of flexible mounts 542 may not induce any lateral displacement in measurement frame 540 due to the high stiffness of measurement frame 540 compared to the stiffness of flexible mounts 542. And, bending force exerted on second ends 542b of flexible mounts 542 during the thermal expansion of support structure 416 may be negligible as measurement frame 540 may not thermally expand due to its low CTE compared to the CTE of support structure 416. Thus, there may be negligible lateral displacement of measurement frame 540 during the thermal expansion of support structure 416. As a result of which, sensing element 438 may not incorrectly sense the thermal expansion of support structure 416 as an unintentional lateral displacement of support structure 416 and measurement axis 431. Thus, measurement frame 540 and flexible mounts 542 help to prevent sensing element 438 from detecting temperature induced lateral movement of support structure 416, and consequently, improve the displacement measurement accuracy of position measurement system 418 in alignment system 500 compared to alignment system 400.

An Alignment System Having a Measurement Frame According to a Second Embodiment

Figure 11:
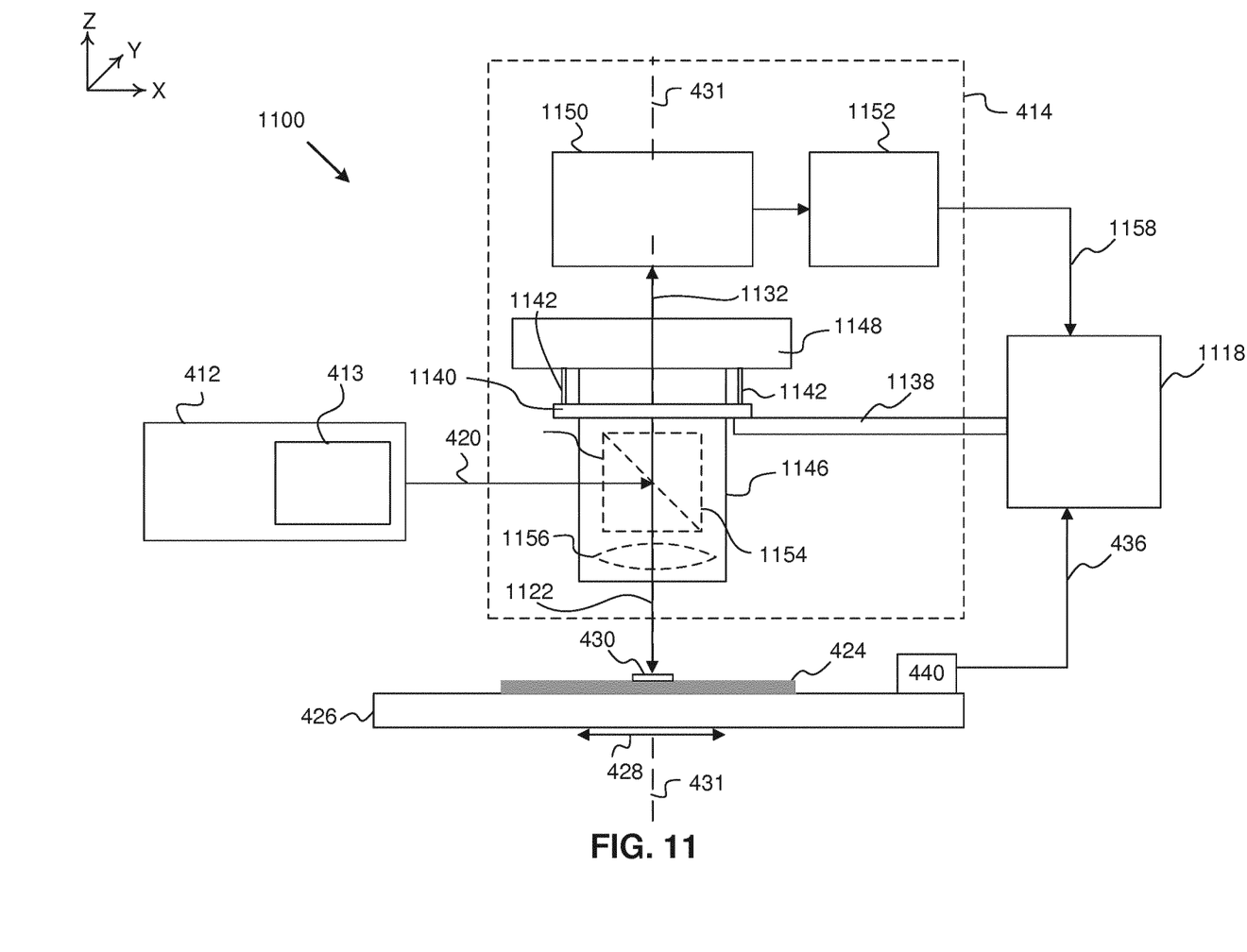
FIG. 11 is a schematic illustration of an alignment system having a measurement system, according to an embodiment of the invention.

FIG. 11 illustrates a schematic of a cross-sectional view of an alignment system 1100 that can be implemented as a part of lithographic apparatus 100 or 100', according to an embodiment. Alignment system 1100 may be similar to alignment systems 400 and 500 in structure and function. The differences between alignment systems 400, 500, and 1100 are discussed below.

Alignment system 1100 may include illumination system 412, sensor system 414, a position measurement system 1118, a sensing element 1138, a measurement frame 1140, and flexible mounts 1142. Sensor system 414 may include an optical system 1146, an optical system support structure 1148, an image rotation interferometer 1150, and a detector 1152. Optical system 1146 may include a beam splitter 1154 and an objective lens 1156. Beam splitter 1154 may be configured to receive radiation beam 420 and direct a radiation sub-beam 1122, which is a part of radiation beam 420 towards objective lens 1154. Objective lens 1156 may be configured to focus radiation sub-beam 1122 onto a substrate 424 placed on a stage 426 moveable along direction 428 (e.g., along X-axis). Radiation sub-beam 1122 may be configured to illuminate an alignment mark 430 (also may be referred as alignment target), formed on substrate 424, along a measurement axis 431 of sensor system 414. Measurement axis 431 may be aligned with an optical axis of optical system 1146 and image rotation interferometer 1150. Objective lens 1154 may be further configured to collect a diffracted radiation beam 1132 and pass it to image rotation interferometer 1150. In an example, diffracted radiation beam 1132 may be at least a portion of radiation sub-beam 1122 that may be reflected from alignment mark 430 when the axis of symmetry of alignment mark 430 is aligned with measurement axis 431.

Image rotation interferometer 1150 may be configured to receive diffracted radiation beam 1132. In an example, image rotation interferometer 1150 comprise any appropriate set of optical elements, for example, a combination of prisms that may be configured to form two images of alignment mark 430 based on the received diffracted radiation beam 1132. It should be appreciated that a good quality image need not be formed, but that the features of alignment mark 430 should be resolved. Image rotation device 1150 may be further configured to rotate one of the two images with respect to the other of the two images one hundred and eighty degrees and recombine the rotated and unrotated images interferometrically.

Detector 1152 may be configured to receive the recombined image from image rotation interferometer 1150 and detect an interference as a result of the recombined image when measurement axis 431 passes through a center of symmetry (not shown) of alignment mark 430. Such interference may be due to alignment mark 430 being one hundred and eighty degree symmetrical, and the recombined image interfering constructively or destructively. Based on the detected interference, detector 1150 may be further configured to determine a position of alignment mark 430 (e.g., position of the center of symmetry of alignment mark 430) and consequently, detect a position of substrate 424 with respect to a first reference element (not shown). First reference element may be any component of alignment system 1100, lithographic apparatus 100 and 100', or a stand-alone structure.

Position measurement system 1118 may be configured to receive signals 1158 and 436. Signal 1158 may include information of the detected positions of alignment mark 430 and substrate 424 and signal 436 may include information of the position of stage 426. Position of stage 426 may be detected by a stage position measurement system 440 coupled to stage 426. Based on the information from signals 1158 and 436, position measurement system 1118 may be configured to correlate the position of stage 426 with the position of alignment mark 430 and substrate 424. As such, the position of alignment mark 430 and the position of substrate 424 may be determined with reference to stage 426 and these positions may be stored in a storage device (not shown) included in position measurement system 1118 or in a processing unit (not shown) coupled to position measurement system 1118.

Position measurement system 1118 may be further configured to detect and correct errors in determining the position of alignment mark 430 and consequently, preventing misalignment of substrate 424. The errors may be due to unintentional displacement of measurement axis 431 from a desired location during the operation of alignment system 1100. Position measurement system 1118 may be configured to measure the unintentional displacement of measurement axis 431 from the desired location with respect to a second reference element. Second reference element may be any component of alignment system 1100, lithographic apparatus 100 and 100', or a stand-alone structure. In an example, the first and second reference elements may be two different elements or may be the same element.

In order to detect these errors due to the unintentional displacement of measurement axis 431, sensing element 1138 may be coupled to position measurement system 1118 and support structure 1148. Support structure 1148 may be configured to hold and couple optical system 1146 to other components of alignment system 1100 and/or lithographic apparatus 100 and 100'. Sensing element 1138 may be similar in structure and function to sensing element 438 described above. Based on the unintentional lateral displacement detected by sensing element 1138, position measurement system 1118 may be configured to measure the displacement and correct the determined position of alignment mark 430 stored in the storage device, and consequently, correct the correlation between the position of stage 426 with the position of alignment mark 430 and substrate 424.

Similar to measurement frame 540 and flexible mounts 542 of alignment system 500, measurement frame 1140 and flexible mounts 1142 of alignment system 1100 may be configured to provide an athermal symmetrical interface between sensing element 1138 and support structure 1148. Such interface may help to prevent the errors, discussed above with reference to alignment system 400, in the detection of lateral displacement of measurement axis 431 due to thermal variations in support structure 1148. Due to the presence of such interface, sensing element 1138 may not incorrectly sense the thermal expansion of support structure 1148 as an unintentional lateral displacement of support structure 1148 and measurement axis 431. As a result, sensing element 1138 may be configured to be substantially insensitive to temperature induced lateral displacement of support structure 1148, and consequently, improve the displacement measurement accuracy of position measurement system 1118 in alignment system 1100.

Measurement frame 1140 and flexible mounts 1142 may be similar to measurement frame 540 and flexible mounts 542 in structure, composition, and function. Also, measurement frame 1140 and flexible mounts 1142 may be arranged with respect to measurement axis 431 in a manner similar to measurement frame 540 and flexible mounts 542 described above with reference to FIGS. 5-10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, Mine 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "displacement of the sensor system" as used herein generally describes a movement of the sensor system that results in a lateral movement of the measurement axis (e.g., an optical axis) of the sensor system.

The term "displacement of the optical system" as used herein generally describes a movement of the optical system that results in a lateral movement of the measurement axis (e.g., an optical axis) of the optical system.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

The term "optically coupled" as used herein generally refers to one coupled element being configured to impart light to another coupled element directly or indirectly.

The term "optical material" as used herein generally refers to a material that allows light or optical energy to propagate therein or therethrough.

The term "center wavelength" as used herein generally refers to a midpoint value between a band of wavelengths at a full width half maximum (FWHM) of a passband.

The term "FWHM of a passband" as used herein generally refers to a band of wavelengths at which optical transmission is 50% of the optical transmission at a peak wavelength of the passband.

The term "passband" as referred herein may be defined as a band of wavelengths that are passed through a filter.

The term "about" as used herein indicates the value of a given quantity varies by ±10% of the value, unless noted otherwise.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. An alignment system comprising:
   a sensor system configured to determine a position of an alignment mark on a substrate the sensor system comprising a measurement axis;
   a support structure configured to support the sensor system;
   a sensing element configured to detect an unintentional displacement of the support structure;
   a position measurement system configured to:
      measure the unintentional displacement relative to a reference element based on the detected unintentional displacement,
      adjust the determined position of the alignment mark based on the measured unintentional displacement of the support structure, and
      adjust a correlation parameter between the position of the alignment mark and the substrate with a position of a stage on which the substrate is placed; and
   an athermal interface, positioned between the sensing element and the support structure, configured to prevent detection of temperature induced displacement of the support structure by the sensing element,
   wherein the athermal interface comprises:
      a measurement frame having a torus geometry and a first stiffness; and
      two or more flexible mounts in a symmetric radial arrangement on the measurement frame, each having a second stiffness less than the first stiffness, and
   wherein the measurement frame and the two or more flexible mounts are symmetrically arranged about the measurement axis such that any symmetrical temperature induced displacement of the support structure with respect to the measurement axis is uniformly distributed on the support structure without causing any resultant displacement of the measurement frame.

2. The alignment system of claim 1, wherein each of the two or more flexible mounts are positioned at an equal distance from the measurement axis.

3. The alignment system of claim 1, wherein each of the two or more flexible mounts are positioned at an equal angular distance from adjacent ones of the two or more flexible mounts.

4. The alignment system of claim 1, wherein the measurement frame has an axis of symmetry aligned to the measurement axis.

5. The alignment system of claim 1, wherein each of the two or more flexible mounts comprises a leaf-spring.

6. The alignment system of claim 1, wherein:
   the measurement frame has a first thermal expansion coefficient; and
   the support structure has a second thermal expansion coefficient that is higher than the first thermal expansion coefficient.

7. The alignment system of claim 6, wherein a ratio of the second thermal expansion coefficient to the first thermal expansion coefficient is greater than about 5 times, about 10 times, about 100 times, about 400 times, or about 1000 times.

8. The alignment system of claim 6, wherein the first thermal expansion coefficient is less than about 5 ppm/K.

9. The alignment system of claim 1, wherein the measurement frame comprises a material with a thermal expansion coefficient less than about 5 ppm/K.

10. The alignment system of claim 1, wherein the measurement frame comprises a non-magnetic material.

11. The alignment system of claim 1, wherein each of the two or more flexible mounts comprises first and second ends, the first and second ends being rigidly coupled to the support structure and the sensing element, respectively.

12. The alignment system of claim 1, wherein the sensor system comprises
   an optical axis aligned to the measurement axis.

13. The alignment system of claim 1, wherein the torus geometry comprises a rectangular cross-section.

14. The alignment system of claim 1, wherein each of the two or more flexible mounts are positioned on the support structure such that a thermal center of the athermal interface and/or the support structure is aligned with the measurement axis.

15. The alignment system of claim 1, wherein each of the two or more flexible mounts comprise tensile and lateral stiffnesses higher than a bending stiffness.

16. A lithographic apparatus comprising:
   an illumination system configured to illuminate a pattern of a patterning device;
   a projection system configured to project an image of the pattern on to a target portion of a substrate; and
   an alignment system comprising:
      a sensor system configured to determine a position of an alignment mark on the substrate, the sensor system comprising a measurement axis;
      a support structure configured to support the sensor system;
      a sensing element configured to detect an unintentional displacement of the support structure;
      a position measurement system configured to:
         measure the unintentional displacement relative to a reference element based on the detected unintentional displacement,
         adjust the determined position of the alignment mark based on the measured unintentional displacement of the support structure, and adjust a correlation parameter between the position of the alignment mark and the substrate with a position of a stage on which the substrate is placed; and an athermal interface, positioned between the sensing element and the support structure, configured to prevent detection of temperature induced displacement of the support structure by the sensing element, wherein the athermal interface comprises:

a measurement frame having a torus geometry and a first stiffness; and two or more flexible mounts in a symmetric radial arrangement on the measurement frame, each having a second stiffness less than the first stiffness, and wherein the measurement frame and the two or more flexible mounts are symmetrically arranged about the measurement axis such that any symmetrical temperature induced displacement of the support structure with respect to the measurement axis is uniformly distributed on the support structure without causing any resultant displacement of the measurement frame.

17. An alignment system comprising:

an optical system configured to focus a radiation beam on an alignment mark on a substrate, the optical system comprising an optical axis;

a detector configured to determine a position of the alignment mark;

a support structure configured to support the optical system;

a sensing element configured to detect an unintentional displacement of the support structure;

a position measurement system configured to:

measure the unintentional displacement relative to a reference element based on the detected unintentional displacement, adjust the determined position of the alignment mark based on the detected unintentional displacement of the support structure, and adjust a correlation parameter between the position of the alignment mark and the substrate with a position of a stage on which the substrate is placed; and an athermal interface, positioned between the sensing element and the support structure, configured to prevent detection of temperature induced displacement of the support structure by the sensing element, wherein the athermal interface comprises:

a measurement frame having a torus geometry and a first stiffness; and two or more flexible mounts in a symmetric radial arrangement on the measurement frame, each having a second stiffness less than the first stiffness, and wherein the measurement frame and the two or more flexible mounts are symmetrically arranged about the optical axis such that any symmetrical temperature induced displacement of the support structure with respect to the optical axis is uniformly distributed on the support structure without causing any resultant displacement of the measurement frame.

18. The alignment system of claim 17, wherein each of the two or more flexible mounts are positioned at an equal distance from the optical axis and at an equal angular distance from adjacent ones of the two or more flexible mounts.

19. The alignment system of claim 17, wherein each of the two or more flexible mounts are positioned on the support structure such that a thermal center of the athermal interface and/or the support structure is aligned with the optical axis.

* * * * *

UNITED STATES PATENT AND TRADEMARK OFFICE
CERTIFICATE OF CORRECTION

PATENT NO. : 10,866,531 B2  
APPLICATION NO. : 16/331710  
DATED : December 15, 2020  
INVENTOR(S) : Cosijns et al.

It is certified that error appears in the above-identified patent and that said Letters Patent is hereby corrected as shown below:

On the Title Page

PCT Publication Number (Item (87)), "WO2018/064157" should be --WO2018/065157--.

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*